US006584126B2

(12) United States Patent
Wang et al.

(10) Patent No.: US 6,584,126 B2
(45) Date of Patent: Jun. 24, 2003

(54) TUNABLE FABRY-PEROT FILTER AND TUNABLE VERTICAL CAVITY SURFACE EMITTING LASER

(75) Inventors: Peidong Wang, Billerica, MA (US); Daryoosh Vakhshoori, Cambridge, MA (US); Parviz Tayebati, Boston, MA (US)

(73) Assignee: CoreTek, Inc., Wilmington, MA (US)

( * ) Notice: Subject to any disclaimer, the term of this patent is extended or adjusted under 35 U.S.C. 154(b) by 0 days.

(21) Appl. No.: 09/750,434

(22) Filed: Dec. 28, 2000

(65) Prior Publication Data

US 2003/0091072 A1 May 15, 2003

Related U.S. Application Data

(63) Continuation-in-part of application No. 09/105,399, filed on Jun. 26, 1998, now Pat. No. 6,438,149.

(51) Int. Cl.[7] ................................................ H01S 3/10
(52) U.S. Cl. ........................................ 372/20; 372/89
(58) Field of Search ..................................... 372/20, 89

(56) References Cited

U.S. PATENT DOCUMENTS

| 4,825,262 A | | 4/1989 | Mallinson |
| 4,859,060 A | | 8/1989 | Katagiri et al. |
| 5,022,745 A | | 6/1991 | Zayhowski et al. |
| 5,142,414 A | | 8/1992 | Koehler |
| 5,291,502 A | * | 3/1994 | Pezeshki et al. ............ 372/20 |
| 5,331,658 A | | 7/1994 | Shieh et al. |
| 5,339,326 A | | 8/1994 | Tsujimura et al. |
| 5,381,434 A | | 1/1995 | Bhat et al. |
| 5,491,710 A | | 2/1996 | Lo |
| 5,561,523 A | | 10/1996 | Blomberg et al. |
| 5,561,680 A | | 10/1996 | Haberern et al. |
| 5,629,951 A | * | 5/1997 | Chang-Hasnain et al. .... 372/20 |
| 5,646,729 A | | 7/1997 | Koskinen et al. |
| 5,739,945 A | * | 4/1998 | Tayebati ..................... 359/291 |
| 5,771,253 A | * | 6/1998 | Chang-Hasnain et al. .... 372/20 |
| 5,818,862 A | | 10/1998 | Salet |
| 5,825,796 A | | 10/1998 | Jewell et al. |
| 5,879,961 A | | 3/1999 | Scott |
| 5,949,801 A | * | 9/1999 | Tayebati ..................... 372/20 |

FOREIGN PATENT DOCUMENTS

| GB | 2029083 A | 3/1980 |
| WO | WO 98/14807 | 4/1998 |

OTHER PUBLICATIONS

Larson, M.C. et al. "Vertical Coupled–Cavity Microinterferometer On GaAs With Deformable–Membrane Top Mirror", IEEE Photonics Technology Letters, vol. 7, No. 4, 382–384, Apr. 1995.
Tran, A.T.T.T. et al., "Surface Micromachined Fabry–Perot Tunable Filter", IEEE Photonics Technology Letters, vol. 8, No. 3, 393–395, Mar. 1996.
Larson, M.C. et al., "Broadly–tunable resonant–cavity light emission", Applied Physics Letters, vol. 67, No. 5, 590–592, Jul. 31, 1995.
Wu, M.S. et al., "Tunable micromachined vertical–cavity surface emitting laser", Electronics Letters, vol. 31, No. 19, pp. 1671–1672, Sep. 14, 1995.
Larson, M.C. et al., "Continuously tunable micromachined vertical cavity surface emitting laser with 18 nm wavelength range", Electronics Letters, vol. 32, No. 4, pp. 330–332, Feb. 15, 1996; and.
Larson, M.C., et al., "Continuously tunable micro–electromechanical vertical–cavity surface–emitting lasers", International Journal of Optoelectronics, 1995, vol. 10, No. 5, pp. 401–408.

* cited by examiner

*Primary Examiner*—Paul Ip
*Assistant Examiner*—Dung Nguyen
(74) *Attorney, Agent, or Firm*—Pandiscio & Pandiscio

(57) ABSTRACT

A tunable Fabry-Perot filter and a tunable vertical cavity surface emitting laser (VCSEL) are disclosed, where both devices utilize an improved dome structure for creating an internal air gap.

20 Claims, 11 Drawing Sheets

TUNABLE FABRY-PEROT FILTER AND TUNABLE VERTICAL CAVITY SURFACE EMITTING LASER

REFERENCE TO PENDING PRIOR PATENT APPLICATION

This is a continuation-in-part of prior U.S. patent application Ser. No. 09/105,399, filed Jun. 26, 1998, now U.S. Pat. No. 6,438,149, by Parviz Tayebati et al. for MICRO-ELECTROMECHANICALLY TUNABLE, CONFOCAL, VERTICAL CAVITY SURFACE EMITTING LASER AND FABRY-PEROT FILTER, which patent application is hereby incorporated herein by reference.

FIELD OF THE INVENTION

This invention relates to photonic devices in general, and more particularly to tunable filters and tunable lasers.

BACKGROUND OF THE INVENTION

Tunable Fabry-Perot filters and tunable vertical cavity surface emitting lasers (VCSEL's) have recently generated considerable interest in the art. This is because these devices are believed to have application for a wide range of different optical components and systems, e.g., wavelength division multiplexing (WDM) fiberoptic systems, switches, routers, highly compact spectroscopic interferometers, optical transreceivers, etc.

In some tunable Fabry-Perot filters and in some tunable VCSEL's, tuning is achieved by using an electrostatic field to move a top mirror relative to a bottom mirror, whereby to change the length of the Fabry-Perot cavity and hence tune the wavelength of the device.

While such a construction is advantageous in that it provides a fast and easy way to tune the device, in practice it has proven difficult to produce relatively uniform devices. Significant performance variations typically occur from device-to-device and from batch-to-batch.

SUMMARY OF THE INVENTION

Accordingly, one object of the present invention is to provide an improved tunable Fabry-Perot filter.

Another object of the present invention is to provide an improved method for fabricating a tunable Fabry-Perot filter.

And another object of the present invention is to provide an improved tunable VCSEL.

Still another object of the present invention is to provide an improved method for fabricating a tunable VCSEL.

These and other objects are addressed by the present invention.

In one form of the invention, there is provided a tunable Fabry-Perot filter which comprises a substrate, a bottom mirror mounted to the top of the substrate, a bottom electrode mounted to the top of the bottom mirror, a thin membrane support atop the bottom electrode, a top electrode fixed to the underside of the thin membrane support, a reinforcer fixed to the outside perimeter of the thin membrane support, and a confocal top mirror set atop the thin membrane support, with an air cavity being formed between the bottom mirror and the top mirror, and with the thin membrane support being in the form of a dome with openings therein, with the openings being small enough, and with sufficient distance therebetween, so as to substantially not affect the overall structural integrity of the dome, while still allowing chemical access to the region inside the dome.

In another form of the invention, there is provided a tunable VCSEL which comprises a substrate, a bottom mirror mounted to the top of the substrate, a gain region mounted to the top of the bottom mirror, a bottom electrode mounted to the top of the gain region, a thin membrane support atop the bottom electrode, a top electrode fixed to the underside of the thin membrane support, a reinforcer fixed to the outside perimeter of the thin membrane support, and a confocal top mirror set atop the thin membrane support, with an air cavity being formed between the bottom mirror and the top mirror, and with the thin membrane support being in the form of a dome with openings therein, with the openings being small enough, and with sufficient distance therebetween, so as to substantially not affect the overall structural integrity of the dome, while still allowing chemical access to the region inside the dome.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein:

FIGS. 3–11 are schematic views illustrating fabrication of the tunable Fabry-Perot filter of FIG. 1, wherein FIG. 3 shows a bottom mirror mounted to the top of a substrate and a bottom electrode mounted to the top of the bottom mirror, FIG. 4 shows a sacrificial structure mounted to the top of the bottom electrode, FIG. 5 shows the sacrificial structure after it has had its peripheral edges modified, FIG. 6 shows a top electrode deposited on the top of the sacrificial structure, FIG. 7 shows a thin membrane support deposited on top of the sacrificial structure, the top electrode and a portion of the bottom electrode, FIG. 8 shows a central aperture formed in the thin membrane support, FIG. 9 shows a reinforcer deposited about the periphery of the thin membrane support, FIG. 10 shows the top of the device after openings have been etched in the dome, and FIG. 11 shows a top mirror deposited on top of the thin membrane support.

DETAILED DESCRIPTION OF THE PREFERRED EMBODIMENTS

Figure 1:
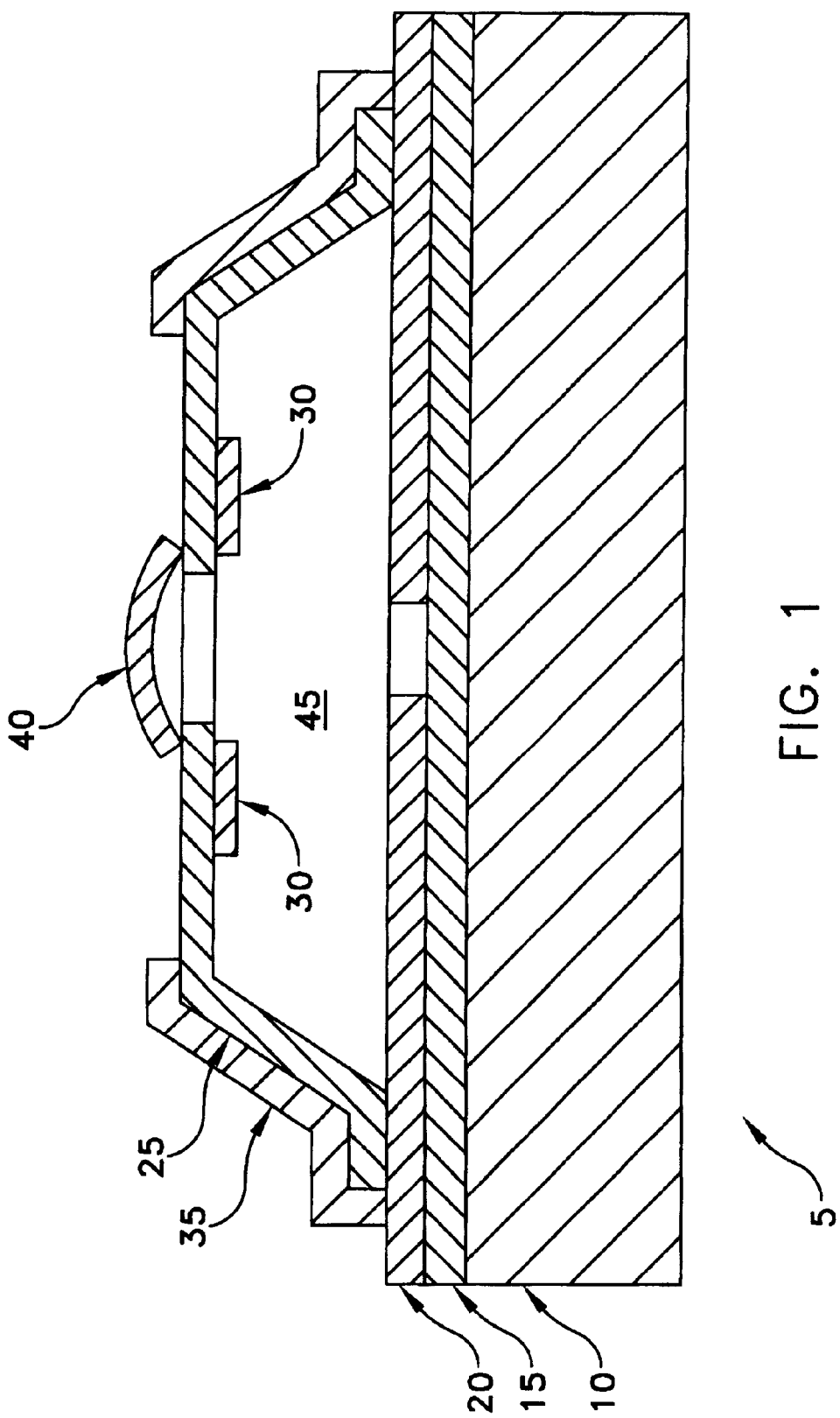
FIG. 1 is a schematic sectional view of a novel tunable Fabry-Perot filter formed in accordance with the present invention.

Looking first at FIG. 1, there is shown a tunable Fabry-Perot filter 5 formed in accordance with the present invention. Filter 5 generally comprises a substrate 10, a bottom mirror 15 mounted to the top of substrate 10, a bottom electrode 20 mounted to the top of bottom mirror 15, a thin membrane support 25 atop bottom electrode 20, a top electrode 30 fixed to the underside of thin membrane support 25, a reinforcer 35 fixed to the outside perimeter of thin membrane support 25, and a confocal top mirror 40 set atop thin membrane support 25, with an air cavity 45 being formed between bottom mirror 15 and top mirror 40.

As a result of this construction, a Fabry-Perot cavity is effectively created between top mirror 40 and bottom mirror 15. Furthermore, by applying an appropriate voltage across top electrode 30 and bottom electrode 20, the position of top mirror 40 can be changed relative to bottom mirror 15, whereby to change the length of the Fabry-Perot cavity, and hence to tune Fabry-Perot filter 5.

Figure 2:
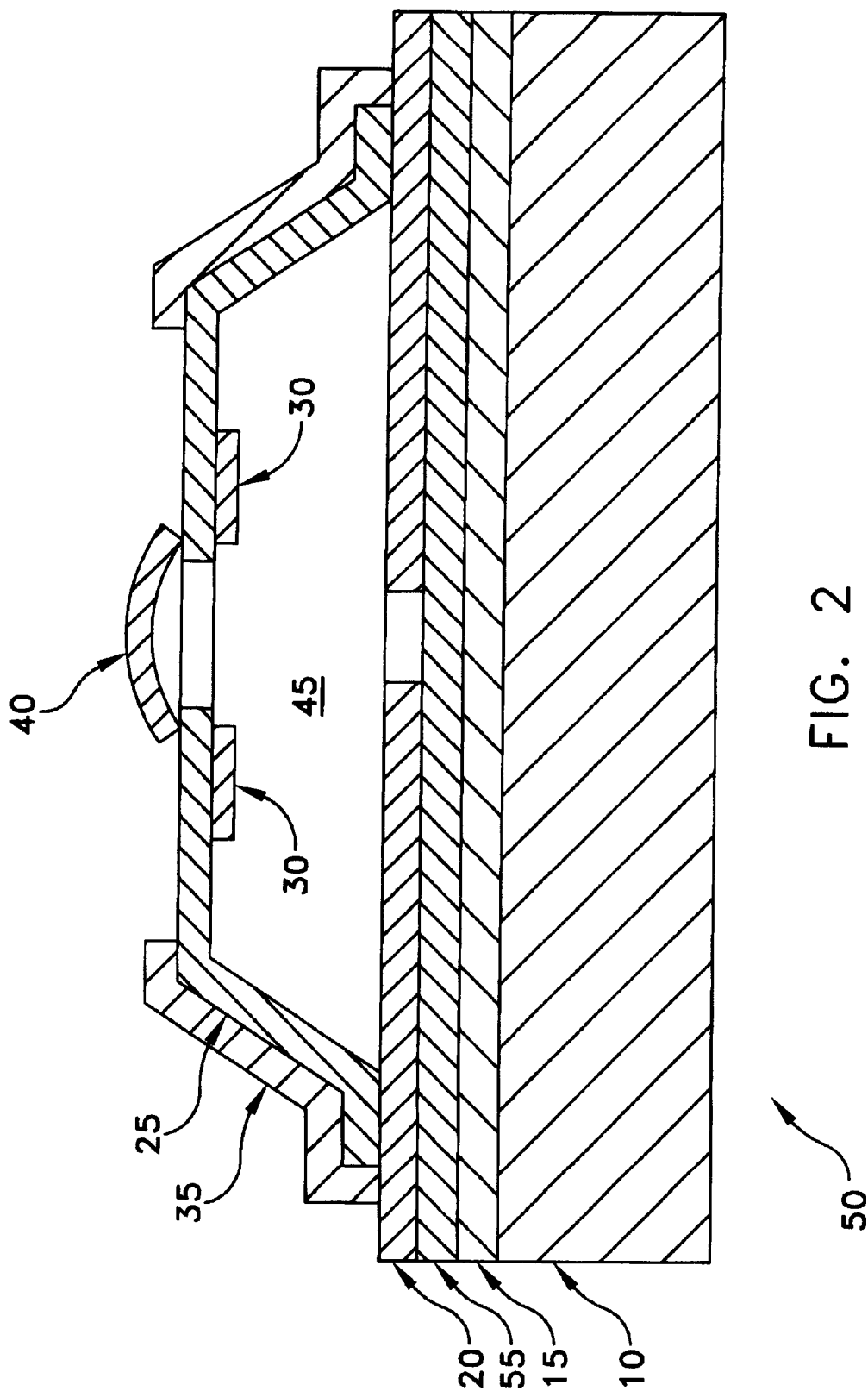
FIG. 2 is a schematic sectional view of a novel tunable VCSEL formed in accordance with the present invention.

Correspondingly, and looking next at FIG. 2, a tunable vertical cavity surface emitting laser (VCSEL) 50 can be constructed by appropriately modifying the construction of Fabry-Perot filter 5, i.e., by positioning a gain region 55 between bottom mirror 15 and bottom electrode 20. As a result of this construction, when gain region 55 is appropriately stimulated, e.g., by optical pumping, lasing can be established within air cavity 45, between top mirror 40 and bottom mirror 15. Furthermore, by applying an appropriate voltage across top electrode 30 and bottom electrode 20, the position of top mirror 40 can be changed relative to bottom mirror 15, whereby to change the length of the laser's resonant cavity, and hence to tune VCSEL 50.

If desired, thin membrane support 25 may be formed as a plurality of separate, relatively thin arms, and reinforcer 35 may be formed as corresponding peripheral posts.

In general, forming thin membrane support 25 as a plurality of separate, relatively thin arms has at least two advantages: (1) it is easier to gain chemical access to the region below thin membrane support 25, whereby to form air cavity 45, and (2) it is easier to move top mirror 40 relative to bottom mirror 15 when an appropriate voltage is applied across top electrode 30 and bottom electrode 20, whereby to tune Fabry-Perot filter 5 or VCSEL 50.

In practice, however, it has been discovered that forming thin membrane support 25 as a plurality of separate, relatively thin arms presents several problems. For convenience, these problems can be collectively referred to as problems of "noise".

More particularly, it has been found that separate, relatively thin support arms tend to vibrate with the mechanical shocks which are frequently encountered in the real world. Such vibrations can cause top mirror 40 to move relative to bottom mirror 15, thereby causing Fabry-Perot filter 5 or VCSEL 50 to move in and out of "focus" or "tune".

Furthermore, as the power of Fabry-Perot filter 5 or VCSEL 50 rises, there can sometimes be a tendency for top mirror 40 to move upward relative to bottom mirror 15, thereby causing the device to move out of "focus" or "tune". In theory, the voltage applied to the device could be correspondingly increased so as to compensate for this effect and bring the device back into "focus" or "tune", but in practice this has proven difficult to regulate. Furthermore, as the voltage applied to the device in increased, the curvature of top mirror 40 can change as well, thereby introducing new problems with device performance.

It has now been discovered that the larger the surface area of thin membrane support 25, and the stiffer it is, the better that the device can resist the "noise" problems described above. Accordingly, in accordance with the present invention, thin membrane support 25 is preferably fabricated in the form of a dome with openings therein, with the openings being small enough, and with sufficient distance therebetween, so as to substantially not affect the overall structural integrity of the dome, while still allowing chemical access to the region inside the dome.

In accordance with the present invention, a Fabry-Perot filter 5 (FIG. 1) may be formed as follows.

Figure 3:
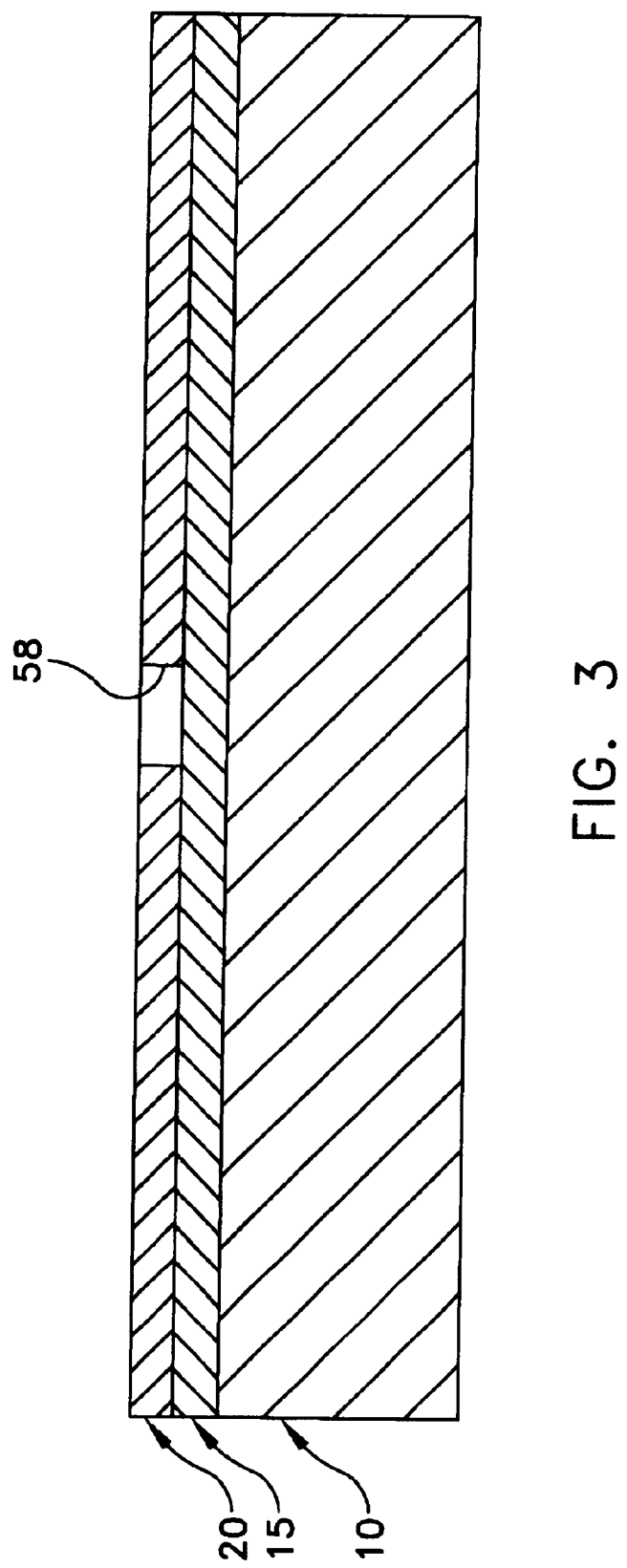

First, starting with a substrate 10 (FIG. 3), a bottom mirror 15 is mounted to the top of the substrate, and then a bottom electrode 20 is mounted to the top of bottom mirror 15. Substrate 10 preferably comprises a semiconductor material such as Si, GaAs, InP or other suitable materials. Bottom mirror 15 preferably comprises a distributed Bragg reflector (DBR) formed out of alternating layers of quarter-wavelength thick deposited dielectric films, e.g., silicon (Si) and aluminum oxide ($Al_2O_3$), or silicon (Si) and silicon dioxide ($SiO_2$), or silicon (Si) and magnesium oxide (MgO), or $TiO_2$ and $SiO_2$, or $Ta_2O_5$ or zirconium oxide, etc. Bottom mirror 15 may be deposited on substrate 10 by any suitable thin film deposition techniques. Bottom electrode 20 includes a central aperture 58.

Figure 4:
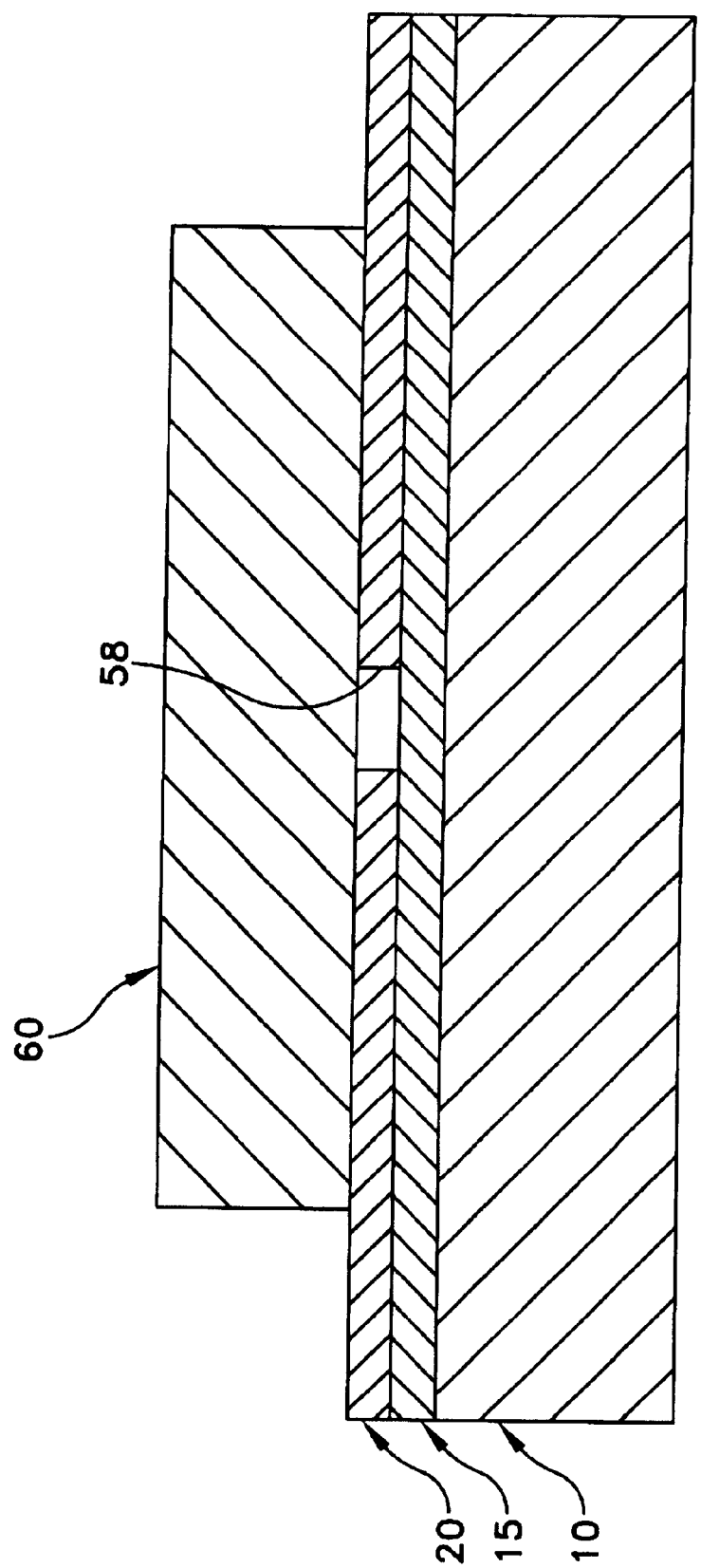

Next, a sacrificial structure 60 (FIG. 4) of polyimide, or aluminum, or some other sacrificial material, is deposited on top of bottom electrode 20 (and, in the region of central aperture 58, bottom mirror 15). The sacrificial structure 60 will act as a sacrificial layer to be removed later in the fabrication process, as described in detail below. It should be appreciated that it is important to accurately control the thickness and lateral dimensions of sacrificial structure 60. This is because the thickness of sacrificial structure 60 will determine the ultimate length of the air cavity 45 in the tunable Fabry-Perot device and, hence, the unbiased resonant wavelength of the device. On the other hand, the lateral dimension of sacrificial structure 60 will determined the voltage response of the device and the resonance frequency. Sacrificial structure 60 preferably has a circular configuration when viewed from the top (although it may, alternatively, have a polygonal configuration if desired). Sacrificial structure 60 may be deposited on bottom electrode 20 (and, in the region of central aperture 58, bottom mirror 15) by evaporation or standard coating methods.

Figure 5:
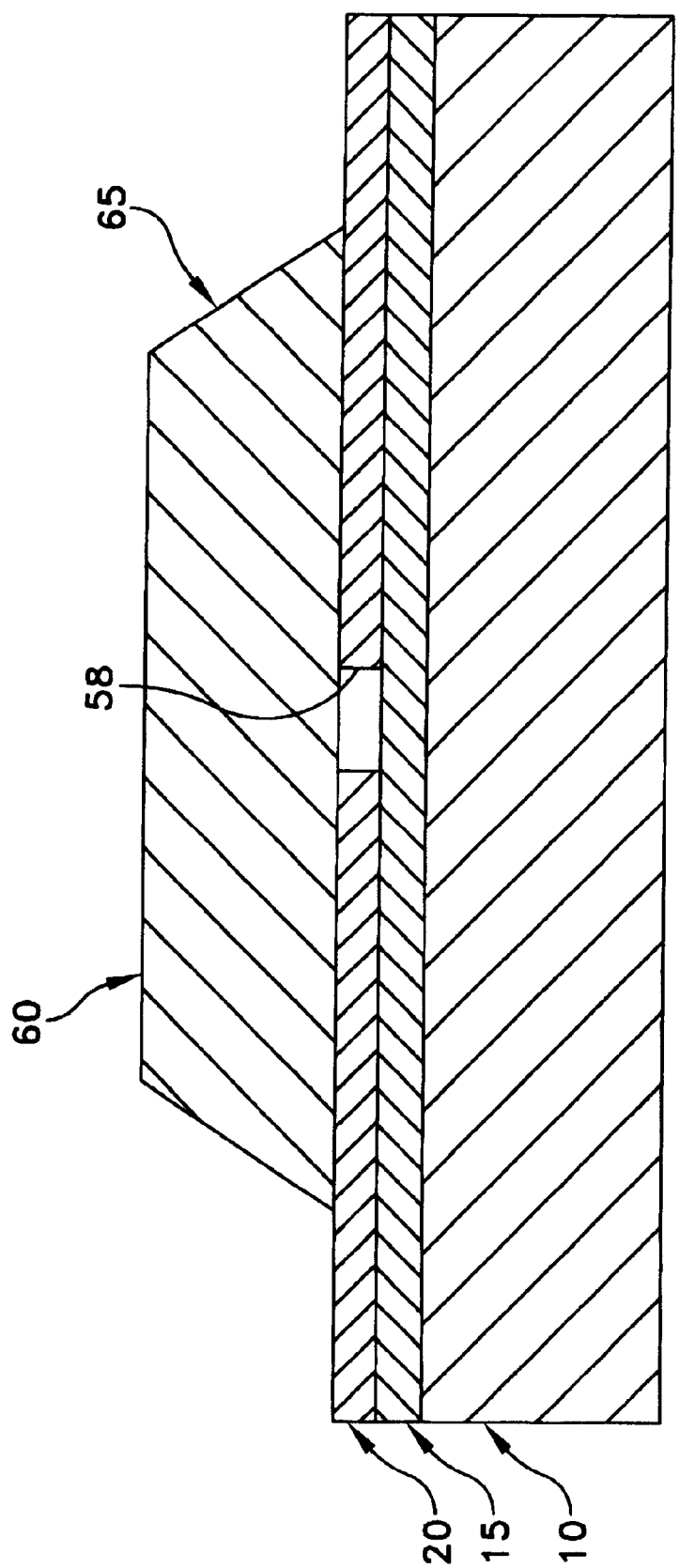

An etch-mask is then used to pattern sacrificial structure 60 so as to leave a circular (or, alternatively, polygonal) disk-shaped deposit defining an outwardly slanted edge 65 on its etched perimeter (FIG. 5). Slanted edge 65 preferably extends at an angle of approximately 45 degrees to the top surface of bottom electrode 20.

Figure 6:
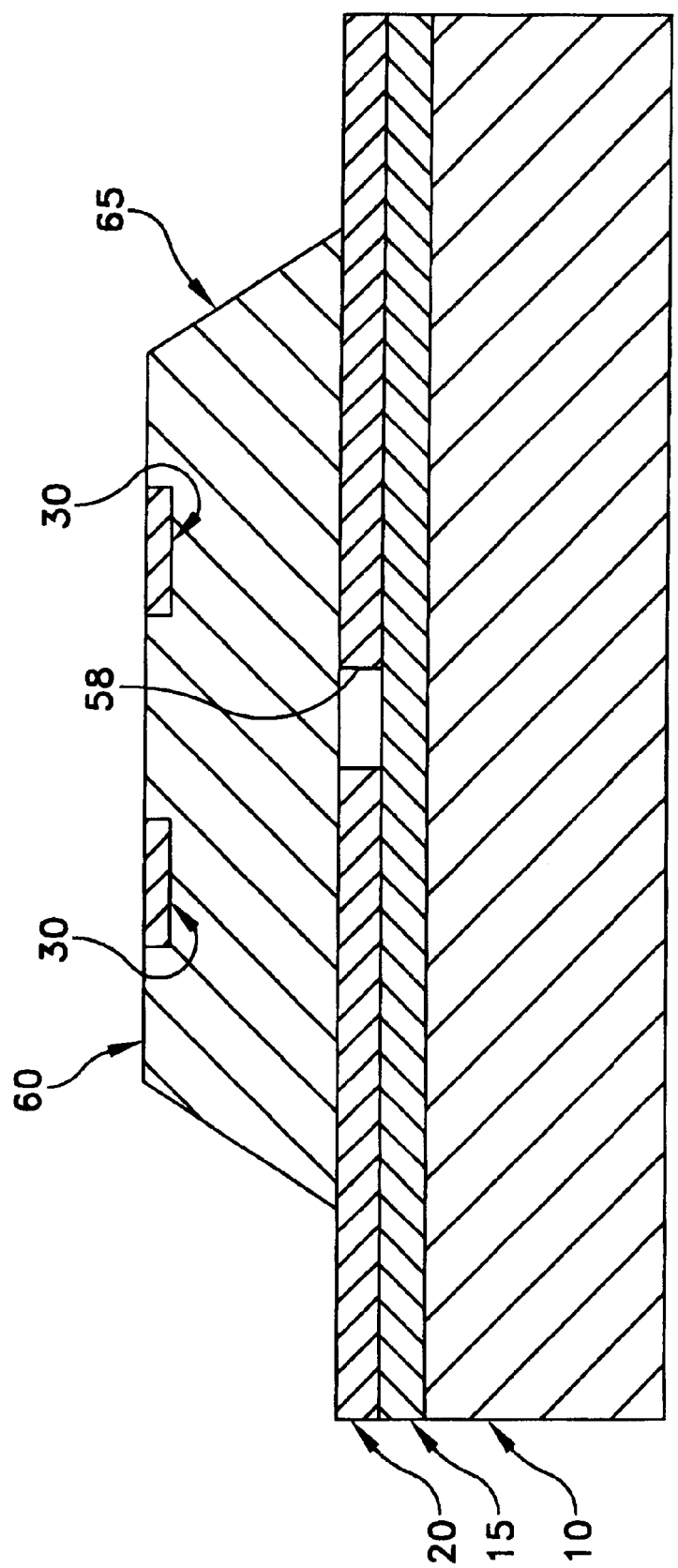

Next, top electrode 30 is deposited on sacrificial structure 60 (FIG. 6). Top electrode 30 may be deposited directly on the top surface of sacrificial structure 60, or top electrode 30 may be deposited into a recess formed in the top surface of sacrificial structure 60, e.g., in the manner shown in FIG. 6. Top electrode 30 preferably has a washer-like configuration, i.e., it preferably has a circular outer perimeter and a circular inner hole.

Figure 7:
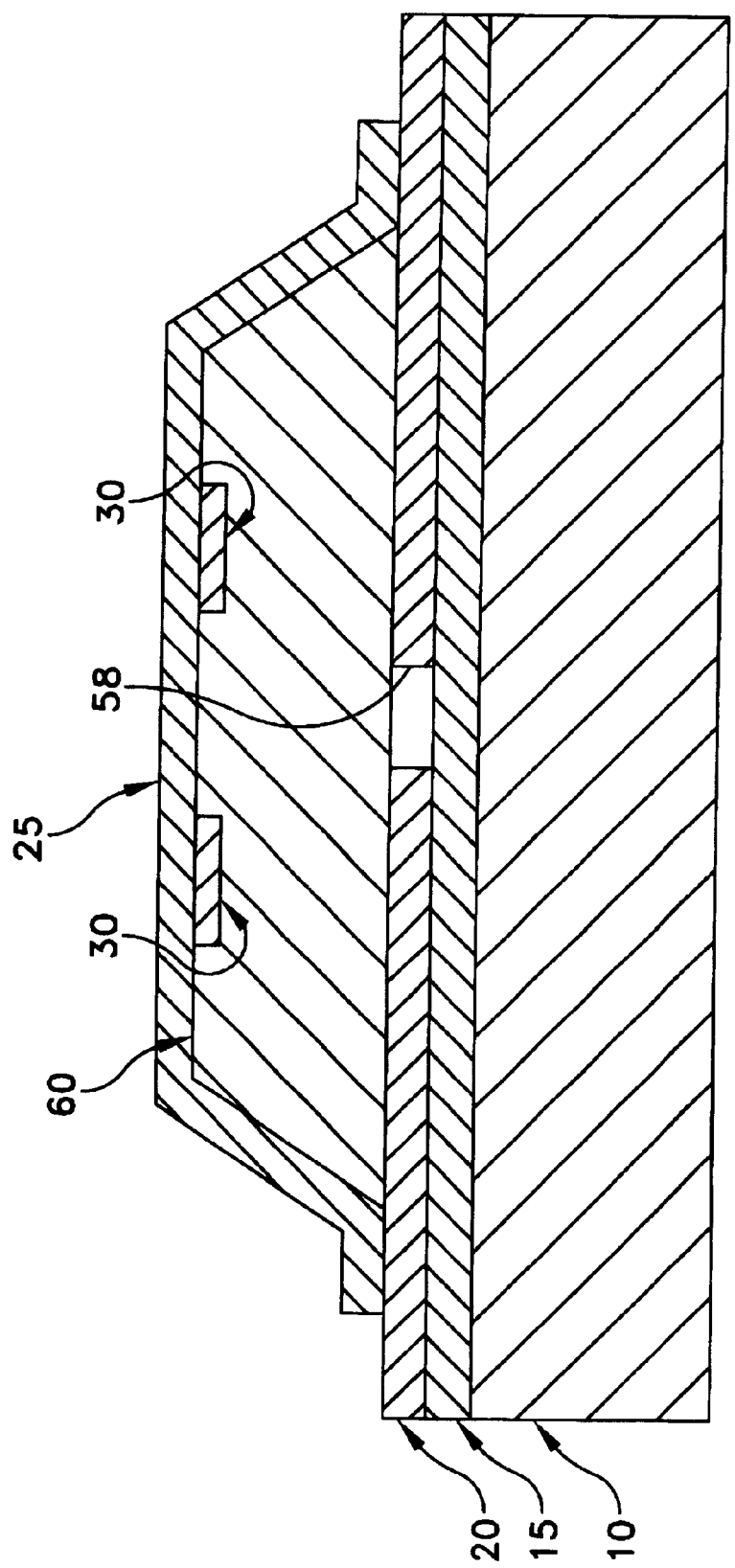

Thereafter, thin membrane support 25 (FIG. 7) is deposited over sacrificial structure 60, top electrode 30 and a portion of bottom electrode 20. Due to the structure of the underlying elements, thin membrane support 25 essentially has a dome configuration. Thin membrane support 25 comprises a material different than the material used to form sacrificial structure 60. By way of example but not limitation, thin membrane support 25 may comprise silicon nitride or a metal, e.g., titanium-tungsten (TiW). Thin membrane support 25 may be deposited on sacrificial structure 60, top electrode 30 and bottom electrode 20 by standard deposition techniques.

Figure 8:
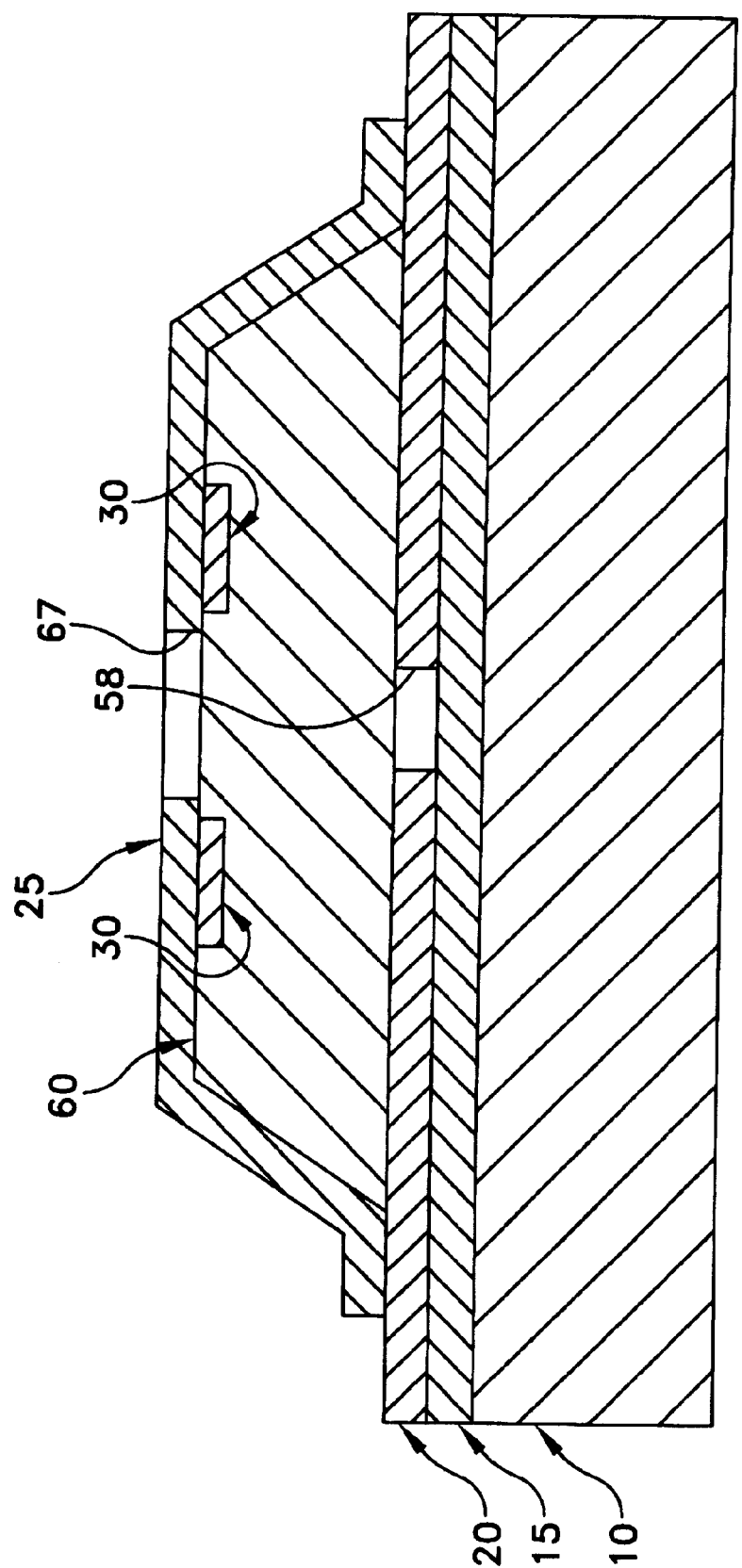

In the case where thin membrane support 25 is formed out of a material which is not transparent, the center portion is removed (FIG. 8) so as to form an aperture 67.

Figure 9:
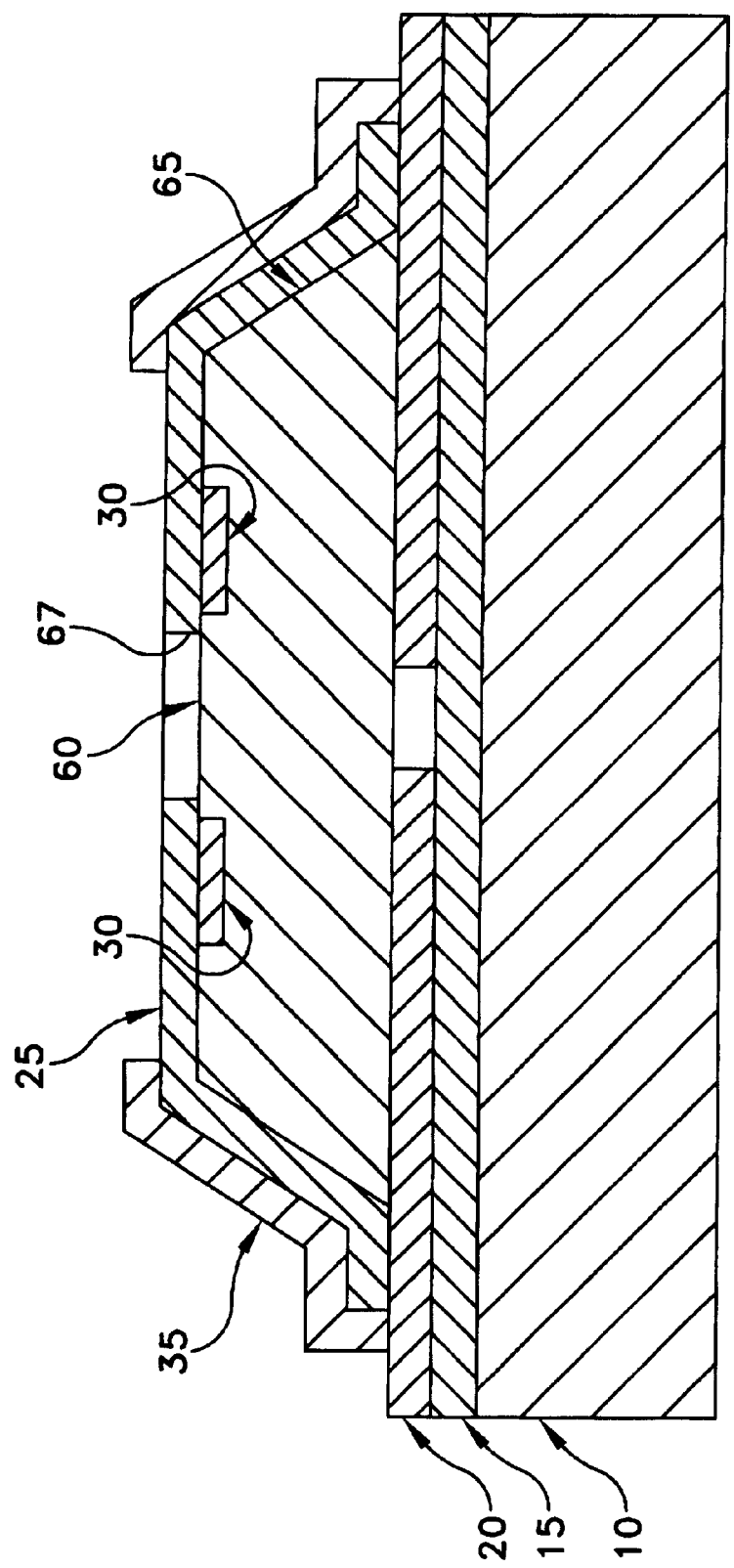

Next, a reinforcer 35 (FIG. 9) made of metal (such as Al or TiW) or a hard dielectric (such as silicon nitride) is selectively deposited on the periphery of thin membrane support 25 so as to form an annular peripheral rim which essentially covers and supports the peripheral portion of thin membrane support 25. The lateral dimension of reinforcer 35 is selected such that a thick metal rim extends from bottom electrode 20, up over the sloped edge 65 of sacrificial structure 60, and up onto the top of the structure, as indicated in FIG. 9. The thick reinforcer 35 (formed out of metal or a hard dielectric) provides robust support for thin membrane support 25 (formed out of silicon nitride or TiW) after the underlying sacrificial structure 60 has been removed (see below). Reinforcer 35 may be deposited on thin membrane support 25 (and, at the periphery of reinforcer 35, bottom electrode 20) by standard deposition techniques.

In essence, thin membrane support 25 comprises a thin dome structure, and reinforcer 35 comprises a thick rim support for the periphery of thin membrane support 25.

Figure 10:
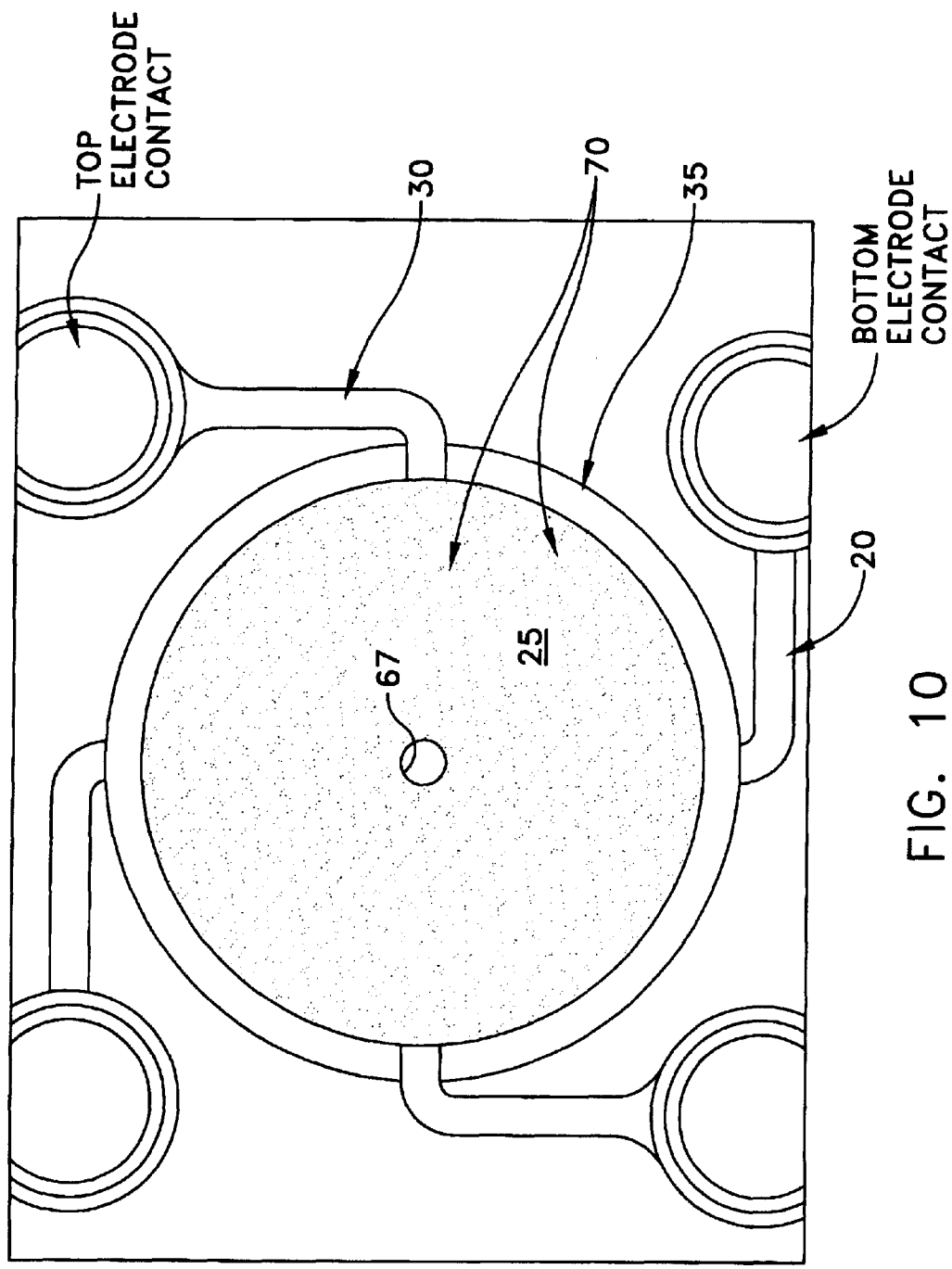

Using an etch-mask, a plurality of small openings 70 (only several of which are highlighted) (FIG. 10) are then formed by etching through thin membrane support 25, down to the underlying sacrificial structure 60. These openings 70 provide gateways for etchants to selectively remove the underlying sacrificial structure 60, as will hereinafter be discussed in further detail. Openings 70 preferably have a circular configuration, although they may also have a polygonal configuration if desired.

Circular openings 70 are formed small enough, and with sufficient distance therebetween, so as to substantially not affect the overall structural integrity of the dome structure of thin membrane support 25, while still allowing chemical access to the region inside the dome.

If desired, openings 70 may also be formed in reinforcer 35. To the extent that openings 70 are formed in reinforcer 35, these openings are sized and spaced so as to substantially not affect the structural integrity of the rim structure of reinforcer 35.

Figure 11:
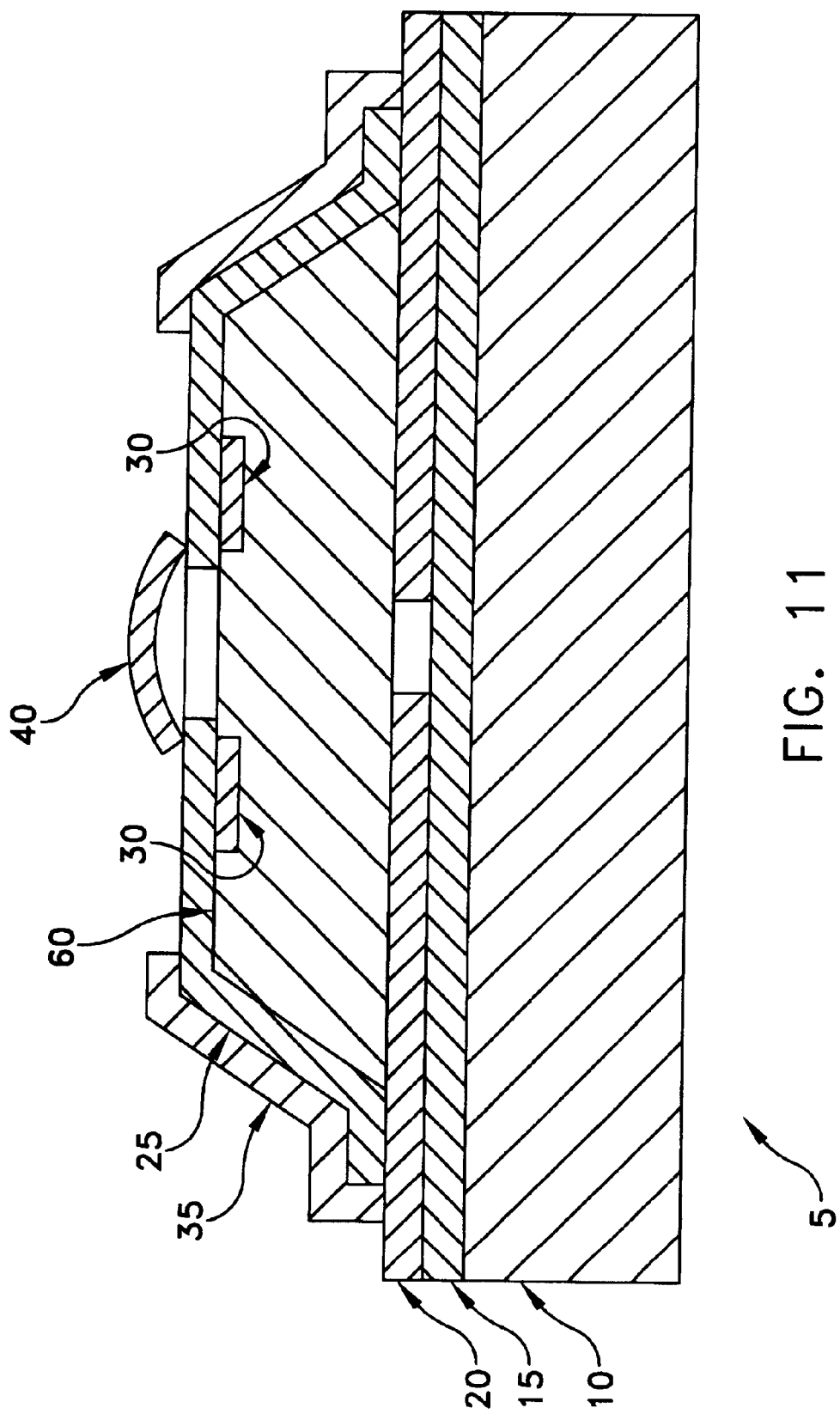

Next, a circular top mirror 40 is then selectively deposited at the center of thin membrane support 25 (FIG. 11). In one preferred form of the invention, top mirror 40 comprises a distributed Bragg reflector (DBR) formed out of alternating layers of quarter-wavelength thick deposited dielectric films, e.g., silicon (Si) and aluminum oxide ($Al_2O_3$), or silicon (Si) and silicon dioxide ($SiO_2$), or silicon (Si) and magnesium oxide (MgO), or $TiO_2$ and $SiO_2$, or $Ta_2O_5$ or zirconium oxide, etc. Top mirror 40 may be deposited on thin membrane support 25 by thin film coating technology.

Top mirror 40 is preferably curved. More particularly, top mirror 40 is preferably curved so that the curved top mirror 40, in combination with the planar bottom mirror 15, together form a confocal stable resonator with a well-defined, near-Gaussian mode structure. In one preferred form of the invention, top mirror 40 has a radius of curvature, with the radius of curvature being optimized so that the mode size of the cavity matches the size of the core of an optical fiber.

To the extent that top mirror 40 is to assume a curved configuration in the completed device (e.g., as shown in FIGS. 1 and 11), an appropriate magnitude and type of strain is introduced into top mirror 40 during deposition of the top mirror. This may be accomplished by controlled changes in deposition temperatures or deposition voltages.

Finally, an etchant is used to selectively remove sacrificial layer 60 and form air gap 45 (FIG. 1). This etchant is introduced to the area under thin membrane support 25 via openings 70, and may comprise an oxygen plasma (in the case where sacrificial structure 60 comprises polyimide) or a $CF_4$ plasma (in the case where sacrificial structure 60 comprises aluminum). This releases thin membrane support 25 along with top mirror 40. To the extent that top mirror 40 is formed with an appropriate magnitude and type of strain to result in the formation of a curved configuration, the removal of sacrificial structure 60 permits the top mirror to assume its desired curved configuration. Since wet chemistry is, preferably, not involved in removing sacrificial structure 60, there is no risk of the released thin membrane support 25 collapsing due to surface tension.

This completes the fabrication of a tunable Fabry-Perot filter.

A tunable VCSEL (FIG. 2) may be formed in corresponding fashion by depositing a gain region 55 between bottom mirror 15 and bottom electrode 20. Gain region 55 may comprise an InGaAsP/InGaAs multiple quantum well (MQW) structure. Gain region 55 may be deposited on bottom mirror 15 by MBE (molecular beam epitaxy) or MOCVD (metal organic chemical vapor deposition) methods, and bottom mirror 20 may be deposited on gain region 55 by MBE or MOCVD or other thin film coating techniques. Lasing can be achieved by photo-pumping with a separate pump laser having a wavelength that is highly absorptive within the gain spectrum of the gain medium used in gain region 55.

The present invention can also be used to produce a current-injected tunable VCSEL as well. In this situation, intra-cavity electrical interconnections are made to the p-i-n junction in the gain structure.

It will be understood that the foregoing detailed description of the preferred embodiments of the invention has been presented by way of illustration and not limitation. Various modifications, variations, changes, adaptations and the like will occur to those skilled in the art in view of the foregoing specification. Accordingly, the present invention should be understood as being limited only by the terms of the claims.

What is claimed is:

1. A tunable Fabry-Perot filter comprising:
   a bottom mirror mounted to the top of a substrate;
   a bottom electrode mounted to the top of said bottom mirror;
   a thin membrane support atop said bottom electrode;
   a top electrode fixed to the underside of said thin membrane support;
   a reinforcer fixed to the outside perimeter of said thin membrane support; and
   a confocal top mirror set atop said thin membrane support, with an air cavity being formed between said bottom mirror and said top mirror;
   and with said thin membrane support being in the form of a dome with openings therein, with said openings being small enough, and with sufficient distance therebetween, so as to the overall structural not affect the overall structure of said dome, while still allowing chemical access to the region inside the dome.

2. A tunable Fabry-Perot filter according to claim 1 wherein said substrate comprises a semiconductor material.

3. A tunable Fabry-Perot filter according to claim 1 wherein said bottom mirror and said top mirror comprise distributed Bragg reflectors.

4. A tunable Fabry-Perot filter according to claim 3 wherein said distributed Bragg reflectors comprise alternating layers of quarter-wavelength thick deposited dielectric films.

5. A tunable Fabry-Perot filter according to claim 4 wherein said dielectric films are fabricated from the group consisting of Si; $Al_2O_3$; $SiO_2$; $TiO_2$; MgO; $Ta_2O_5$; zirconium oxide; or any combination thereof.

6. A tunable Fabry-Perot filter according to claim 1 wherein said openings comprise circular holes.

7. A tunable Fabry-Perot filter according to claim 1 wherein said thin membrane support is formed from a material selected from the group consisting of silicon nitride and titanium-tungsten (TiW).

8. A tunable Fabry-Perot filter according to claim 1 wherein said bottom mirror is planar and said top mirror is curved, so as to form, between said mirrors, a confocal stable resonator.

9. A tunable Fabry-Perot filter according to claim 8 wherein said confocal stable resonator has a well-defined near-Gaussian mode structure.

10. A tunable Fabry-Perot filter according to claim 8 wherein said top mirror has a radius of curvature, said radius of curvature being optimized such that said mode size of said cavity matches the size of the core of an optical fiber.

11. A tunable laser comprising:
   a substrate;
   a bottom mirror mounted to the top of said substrate;
   a gain region mounted to the top of said bottom mirror;
   a bottom electrode mounted to the top of said gain region;
   a thin membrane support atop said bottom electrode;
   a top electrode fixed to the underside of said thin membrane support;
   a reinforcer fixed to the outside perimeter of said thin membrane support; and
   a confocal top mirror set atop said thin membrane support;
   with an air cavity being formed between said bottom mirror and said top mirror;
   and with said thin membrane support being in the form of a dome with openings therein, with said openings being small enough, and with sufficient distance therebetween, so as to the overall structural not affect the overall structure of the dome, while still allowing chemicals to be introduced into the region inside the dome.

12. A tunable laser according to claim 11 wherein said substrate comprises a semiconductor material.

13. A tunable laser according to claim 11 wherein said bottom and top mirrors comprise distributed Bragg reflectors.

14. A tunable laser according to claim 13 wherein said distributed Bragg reflectors comprise alternating layers of quarter-wavelength thick deposited dielectric films.

15. A laser according to claim 14 wherein said dielectric films are fabricated from the group consisting of Si; $Al_2O_3$; $SiO_2$; $TiO_2$; MgO; $Ta_2O_5$; zirconium oxide; or any combination thereof.

16. A tunable laser according to claim 11 wherein said openings comprise circular holes.

17. A tunable laser according to claim 11 wherein said thin membrane support is formed from a material selected from the group consisting of silicon nitride and titanium-tungsten (TiW).

18. A tunable laser according to claim 11 wherein said bottom mirror is planar and said top mirror is curved, so as to form, between said mirrors, a confocal stable resonator.

19. A tunable laser according to claim 18 wherein said confocal stable resonator has a well-defined near-Gaussian mode structure.

20. A tunable laser according to claim 18 wherein said top mirror has a radius of curvature, said radius of curvature being optimized such that said mode size of said cavity matches the size of the core of an optical fiber.

* * * * *